United States Patent
Kim (10) Patent No.: US 7,779,317 B2
(45) Date of Patent: Aug. 17, 2010

(54) TEST CONTROL CIRCUIT AND REFERENCE VOLTAGE GENERATING CIRCUIT HAVING THE SAME

(75) Inventor: Youk Hee Kim, Ichon (KR)

(73) Assignee: Hynix Semiconductor Inc. (KR)

( * ) Notice: Subject to any disclaimer, the term of this patent is extended or adjusted under 35 U.S.C. 154(b) by 277 days.

(21) Appl. No.: 11/963,463

(22) Filed: Dec. 21, 2007

(65) Prior Publication Data

US 2009/0002029 A1    Jan. 1, 2009

(30) Foreign Application Priority Data

Jun. 28, 2007    (KR)    .................... 10-2007-0064634

(51) Int. Cl.
*G01R 31/28* (2006.01)
*G01V 3/00* (2006.01)

(52) U.S. Cl. .................... 714/724; 327/334

(58) Field of Classification Search .............. None
See application file for complete search history.

(56) References Cited

U.S. PATENT DOCUMENTS

| | | | |
|---|---|---|---|
| 5,263,031 A | 11/1993 | Inoue | |
| 5,687,180 A | 11/1997 | Kawasaki | |
| 5,901,105 A | 5/1999 | Ong et al. | |
| 6,108,804 A * | 8/2000 | Derner | 714/721 |
| 6,940,765 B2 | 9/2005 | Kyung | |
| 7,000,160 B2 * | 2/2006 | Tanaka et al. | 714/724 |
| 7,451,053 B2 * | 11/2008 | Jeong | 702/99 |

FOREIGN PATENT DOCUMENTS

| | | |
|---|---|---|
| JP | 09-106698 | 4/1997 |
| JP | 2005-071582 | 3/2005 |
| KR | 1020060027436 A | 3/2006 |
| KR | 1020070034786 A | 3/2007 |

* cited by examiner

*Primary Examiner*—Christine T Tu
(74) *Attorney, Agent, or Firm*—Baker & McKenzie LLP (57) ABSTRACT

A test control circuit according to an embodiment of the invention includes a test mode control unit that outputs a control signal according to a voltage trimming test signal, a decoding portion that receives the control signal and outputs a decoding signal, and a trimming signal adjusting portion that receives the decoding signal and outputs a trimming signal adjusted by a low level test signal.

19 Claims, 6 Drawing Sheets

TEST CONTROL CIRCUIT AND REFERENCE VOLTAGE GENERATING CIRCUIT HAVING THE SAME

CROSS-REFERENCE TO RELATED PATENT APPLICATION

This application claims the benefit under 35 U.S.C. 119 (a) of Korean Patent Application No. 10-2007-0064634, filed on Jun. 28, 2007, in the Korean Intellectual Property Office, the disclosure of which is incorporated herein in its entirety by reference as if set forth in full.

BACKGROUND

1. Technical Field

The embodiments described herein relate to semiconductor integrated circuits, and in particular, to apparatus and methods for a test control circuit and a reference voltage generating circuit having the same.

2. Related Art

A conventional semiconductor integrated circuit includes internal voltage generating circuits that generate various kinds of internal voltages, of various voltage levels from a relatively high voltage, external power supply. Conventional semiconductor integrated circuits are fabricated via a series of manufacturing processes and are tested for normal operation before the device is shipped. For example, a conventional semiconductor integrated circuit can be subject to an internal voltage trimming test. An internal voltage trimming test determines whether an internal voltage is outside of a prescribed voltage range, e.g., due to manufacturing tolerances or changes in manufacturing processes, and when the internal voltage is out of the prescribed voltage range, then trims the internal voltage such that the internal voltage falls within the prescribed voltage range. A conventional internal voltage trimming test can determine the optimum internal voltage for the semiconductor integrated circuit and control an internal voltage generating circuit of the semiconductor integrated circuit to control the level of the internal voltage so as to achieve the optimum voltage level.

Figure 1:
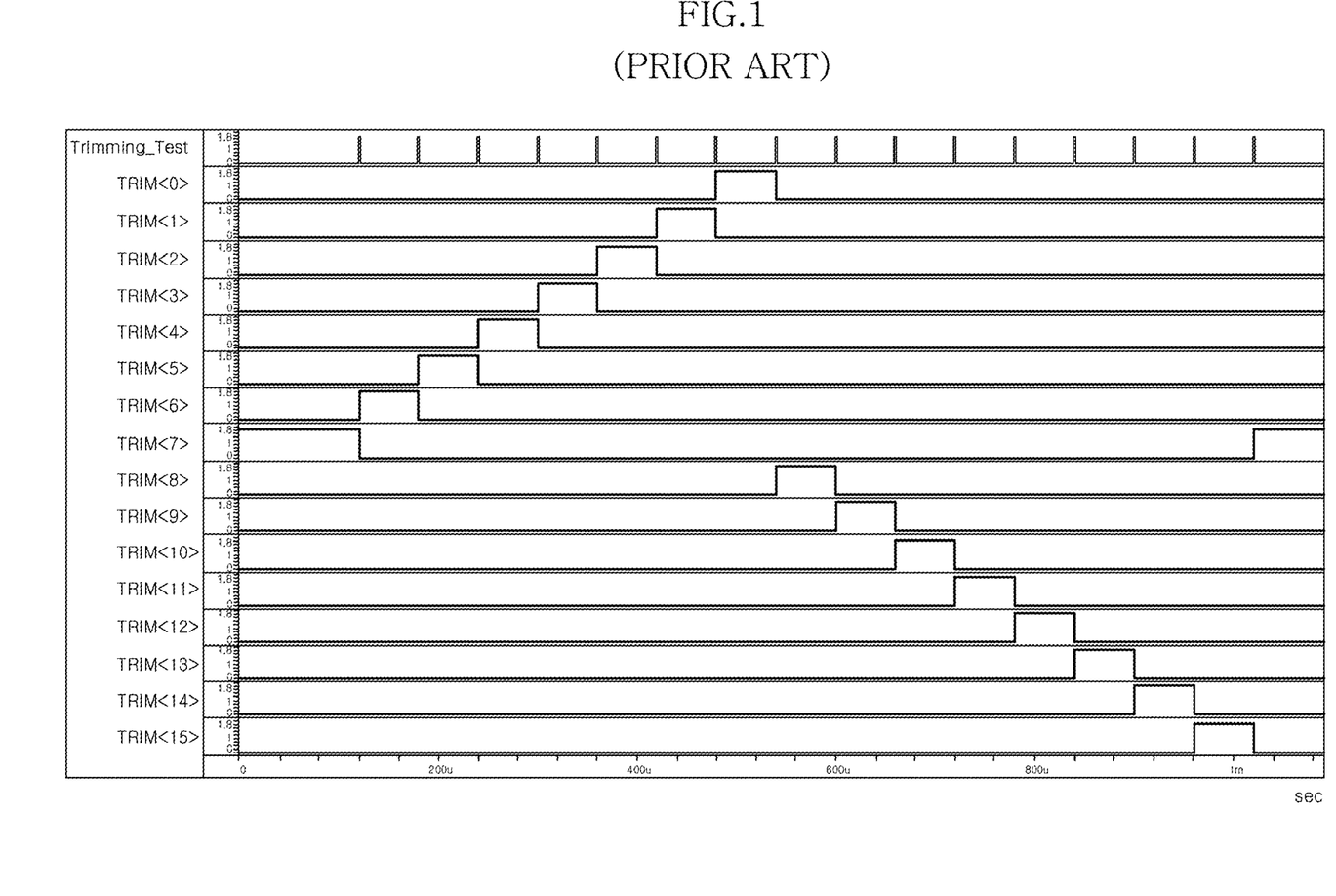
FIG. 1 is a timing diagram illustrating the operation of an exemplary test control circuit.

FIG. 1 is a timing diagram illustrating the operation of a conventional test control circuit. As can be seen, a conventional test control circuit receives a pulsed voltage trimming test signal (Trimming_Test), and outputs a 15-bit trimming signal (TRIM<0:15>). Each bit of the 15-bit trimming signal (TRIM<0:15>) can be viewed as an individual signal (TRM<0>), TRM<1>), . . . (TRM<14>). In this example, before the test starts, the seventh trimming signal (TRIM<7>) is at a high voltage level, and the other trimming signals (TRIM<0:6>) and (TRIM<8:15>) are all at a low voltage level. Each time the voltage trimming test signal (Trimming_Test) is received, one of the trimming signals TRIM<0:15> goes high, and the other trimming signals go, or remain low.

Referring to FIG. 1, it can be seen that, each time the voltage trimming test signal (Trimming_Test) is received, the sixth, fifth, fourth trimming signals (TRIM<6>), (TRIM<5>), (TRIM<4>), etc., sequentially go high, and after the zero-th trimming signal (TRIM<0>) goes high, the eighth, ninth, tenth trimming signals, (TRIM<8>);(TRIM<9>); (TRIM<10>), etc., go high sequentially.

Accordingly, a conventional test control circuit can generate a reference voltage based on the trimming signals TRIM<0:15>, and can determine the optimum reference voltage condition for the internal circuit using the reference voltage.

As shown in FIG. 1, during a conventional voltage trimming test, a voltage is supplied from the outside. If the voltage to be supplied from the outside (hereinafter, referred to as 'external voltage') is higher than the voltage of the internal circuit, no problems occur. However, if the external voltage is lower than the potential of the internal circuit, a current may flow from the internal circuit to a pad to which the external voltage is supplied. Therefore, it is necessary to implement a circuit that can perform a normal voltage trimming test when the external voltage is lower than that of the circuit being tested.

SUMMARY

A test control circuit that can prevent current from flowing from an internal circuit to the outside during a voltage trimming test, and a reference voltage generating circuit using the same are described herein.

According to one aspect, a test control circuit includes a test mode control unit that outputs a control signal according to a voltage trimming test signal, a decoding portion that receives the control signal and outputs a decoding signal, and a trimming signal adjusting portion that receives the decoding signal and outputs a trimming signal, the level of which is adjusted by a low level test signal.

According to another aspect, there is provided a reference voltage generating circuit having a test control circuit. The reference voltage generating circuit includes a test mode control unit that outputs a control signal according to a voltage trimming test signal, a trimming signal adjusting portion that receives the control signal and outputs a plurality of trimming signals, the levels of which are adjusted by a low level test signal, and a reference voltage generation block that receives the trimming signals and generate an internal reference voltage.

According to still another aspect, there is provided a reference voltage generating circuit having a test control circuit. The reference voltage generating circuit includes a first test control block that outputs one of a plurality of trimming signals according to a low level test signal, a first internal reference voltage generation block that generates a first internal reference voltage according to the output of the first test control block, a second test control block that outputs one of the plurality of trimming signals according to the low level test signal, and a second internal reference voltage generation block that generates a second internal reference voltage according to the output of the second test control block.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

Figure 2:
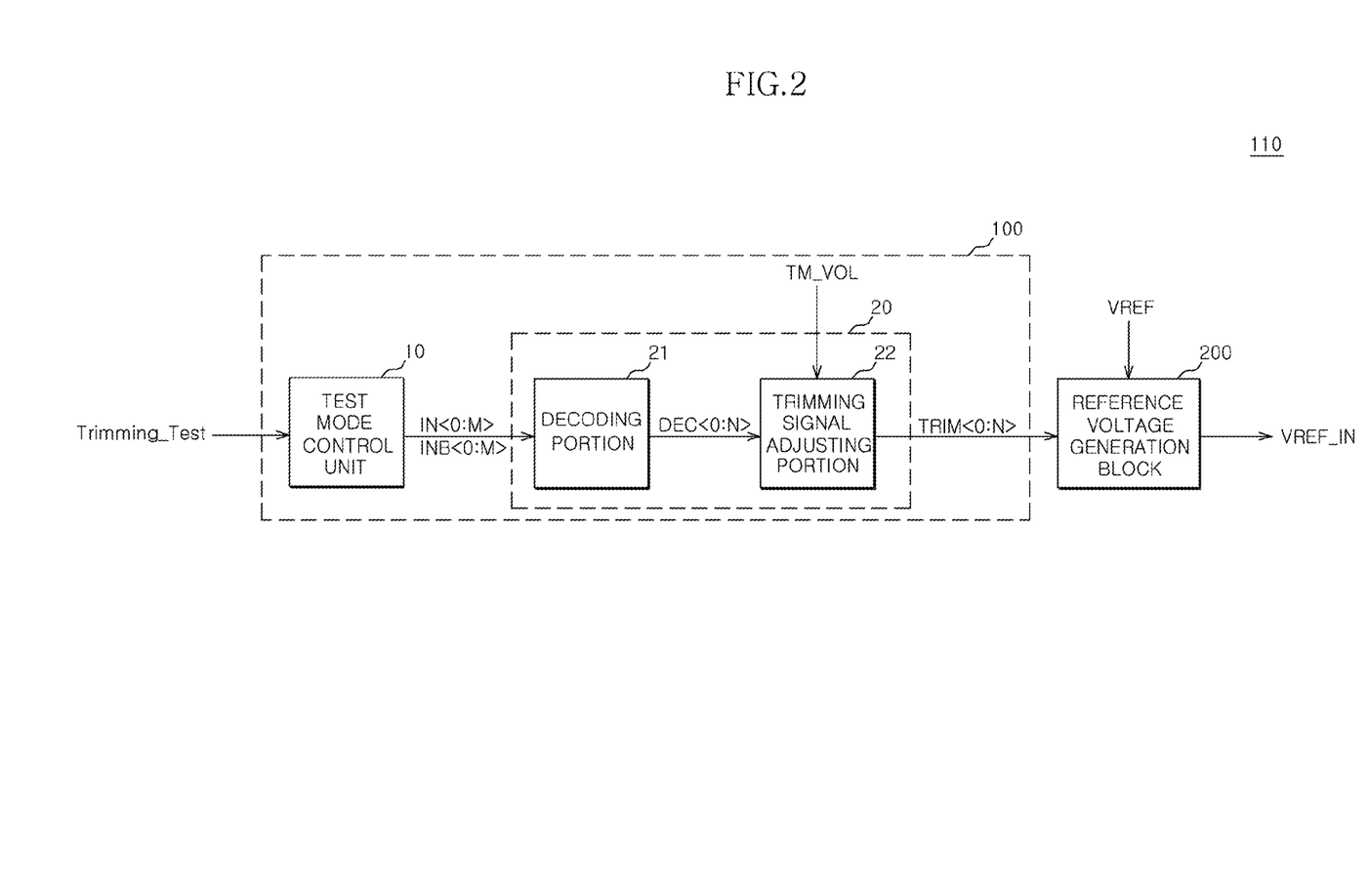
FIG. 2 is a block diagram showing a reference voltage generating circuit comprising a test control circuit according to one embodiment.

FIG. 2 is a diagram illustrating a reference voltage generating circuit 110 according to one embodiment. As can be seen, circuit 110 includes a test mode control unit 10, a trimming signal generation unit 20, and a reference voltage generation block 200. The test mode control unit 10 and the trimming signal generation unit 20 constitute a test control circuit 100 in accordance with one embodiment.

The test mode control unit 10 can be configured to output control signals (IN<0:M>) and (INB<0:M>) (where M is an integer number) according to a voltage trimming test signal (Trimming_Test). The test mode control unit 10 can, depending on the embodiment, be implemented by a counter circuit that performs a count operation each time the voltage trimming test signal (Trimming_Test) is enabled, e.g., is pulsed high. For example, each time the voltage trimming test signal (Trimming_Test) goes high, the test mode control unit 10 can be configured to output the control signals (IN<0:M>) and (INB<0:M>) having, e.g., the values 0000, 0001, 0010, . . . 1111.

The trimming signal generation unit 20 can include a decoding portion 21 and a trimming signal adjusting portion 22. The decoding portion 21 can be configured to receive the control signals (IN<0:M>) and (INB<0:M>) and output a decoding signal (DEC<0:N>) (where N is an integer number). For example, if 4-bit control signals (IN<0:M>) and (INB<0:M>) are input to the decoding portion 21, the decoding portion 21 can output a 16-bit decoding signal (DEC<0:N>). For example, if the bit values for the control signals (IN<0:M>) and (INB<0:M>) are '0010', only the second bit, or signal (DEC<2>) of the decoding signal (DEC<0:15>) goes high, and the remaining bits, or signals (DEC<0:1>) and (DEC<3:15>) remain or go low.

The trimming signal adjusting portion 22 can be configured to receive the decoding signal (DEC<0:N>) and output an N-bit trimming signal (TRIM<0:N>), the levels of which are adjusted by a low level test signal (TM_VOL). The trimming signal adjusting portion 22 can be configured to enable one of the N-bit signals of trimming signal (TRIM<0:N>) according to the low level test signal (TM_VOL).

When the low level test signal (TM_VOL) is enabled, the trimming signal adjusting portion 22 can be configured to enable a predetermined trimming signal (TRIM<n>) regardless of the bit values for the decoding signal (DEC<0:N>). For example, if the bit values for the control signals (IN<0:M>) and (INB<0:M>) are '0010', only the second decoding signal (DEC<2>) goes high. However, in a period during which the low level test signal (TM_VOL) is enabled, the second trimming signal TRIM<2> corresponding to the second decoding signal DEC<2> does not necessarily go high. Rather, a predetermined trimming signal TRIM<n> (for example, n=14) can go high.

When the low level test signal (TM_VOL) is disabled, the trimming signal adjusting portion 22 can be configured to enable the trimming signals TRIM<0:N>, corresponding to the information of the decoding signals DEC<0:N>, to go high as appropriate. For example, if the low level test signal (TM_VOL) is at a low voltage level, a trimming signal corresponding to an activated decoding signal is activated, i.e., if the second decoding signal (DEC<2>) is at a high voltage level, then the second trimming signal (TRIM<2>) goes high in response.

According to certain embodiments, as the low level test signal (TM_VOL) is enabled, a predetermined trimming signal (TRIM<n>) (where n is an integer number of N or less) is immediately enabled. Therefore, it is possible to nearly instantly generate a low-level internal reference voltage, thereby reducing a test time.

The trimming signal adjusting portion 22 can be configured to prevent a current from flowing from the internal circuit to the outside when the external voltage to be supplied from the outside is lower than the potential of the internal circuit during the voltage trimming test. That is, during the test, the trimming signal adjusting portion 22 can be configured to reduce internal reference voltages, which are the source voltages of the internal voltages to be supplied to the chip, to thereby reduce the internal potential. As is known, the levels of the reference voltages are adjusted by the trimming signals (TRIM<0:N>). Accordingly, it is possible to control the flow of a current by adjusting the levels of the trimming signals (TRIM<0:N>) so as to reduce the reference voltages. For example, in n the embodiments described herein, during the voltage trimming test, the trimming signals (TRIM<0:N>) are adjusted such that an internal reference voltage at a lowest level is output.

The reference voltage generation block 200 can be configured to receive the trimming signals (TRIM<0:N>) and to generate the internal reference voltage VREF_IN. The reference voltage generation block 200 can be implemented by a general reference voltage generating circuit. That is, the reference voltage generation block 200 can be configured to generate a voltage at a predetermined level according to the trimming signals (TRIM<0:N>).

The operation of the reference voltage generating circuit 110 shown in FIG. 2 will now be described in more detail.

During a voltage trimming test, the voltage trimming test signal (Trimming_Test) can be applied in a pulsed manner, and the low level test signal (TM_VOL) can be activated. The test mode control unit 10 can be configured to output the control signals (IN<0:M>) and (INB<0:M>), the values of which are obtained by sequentially performing a count operation according to the voltage trimming test signal (Trimming_Test). For example, the control signals can have the values 0001, 0010, 0011, . . . 1111, each time the voltage trimming test signal (Trimming_Test) is applied.

The decoding portion 21 can be configured to then decode the control signals and sequentially activate the corresponding decoding signals (DEC<0>), (DEC<1>), (DEC<2>), . . . , (DEC<N>). Since the low level test signal (TM_VOL) is at a high level, the trimming signal adjusting portion 22 can activate the N-th trimming signal (TRIM<N>) regardless of the information of the received decoding signals (DEC<0:N>), and leave the other trimming signals deactivated.

In response to the activated N-th trimming signal (TRIM<N>), the reference voltage generation block 200 outputs an internal reference voltage VREF_IN at the lowest level corresponding to the N-th trimming signal (TRIM<N>). Accordingly, the potentials of the internal circuits that receive the internal reference voltage VREF_IN are reduced. That is, during the voltage trimming test, the potential of the internal circuit is immediately reduced, thereby reducing the test time. In addition, it is possible to prevent a current from flowing from the internal circuit to the outside when the voltage of the internal circuit is lower than the external voltage.

Figure 3:
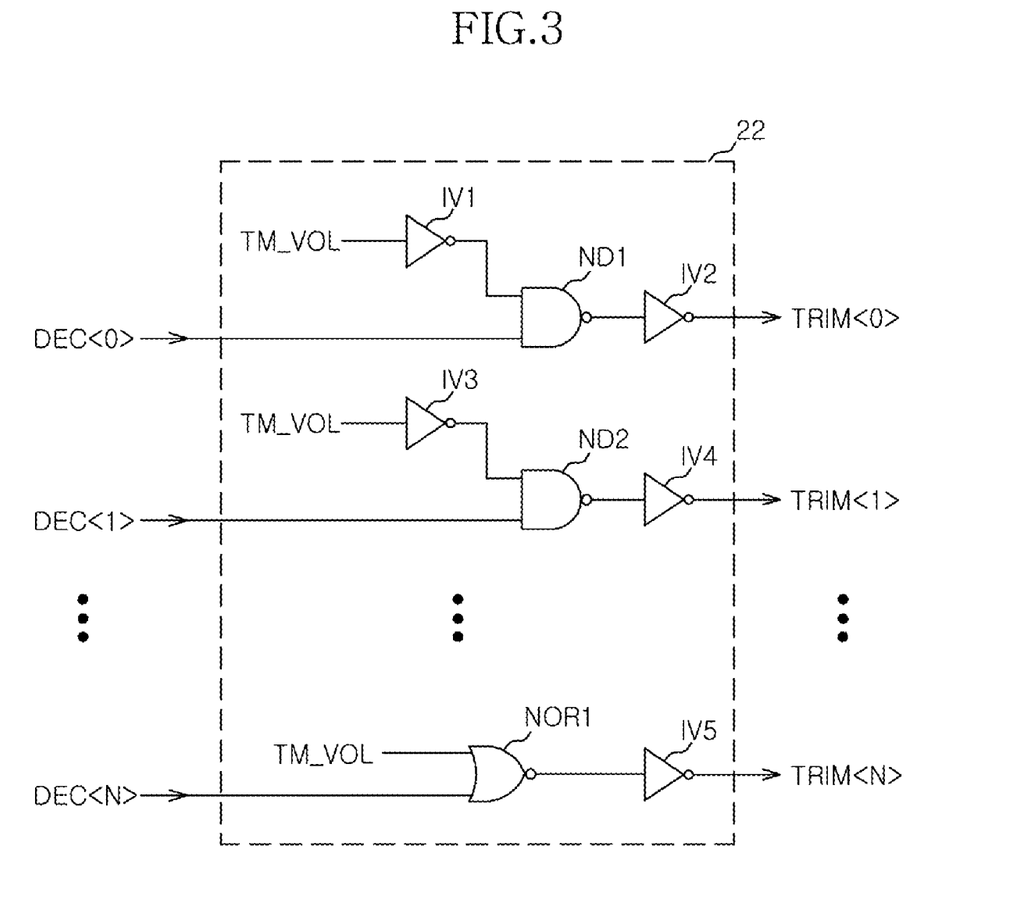
FIG. 3 is a circuit diagram showing an example of a trimming signal adjusting portion of the circuit shown in FIG. 2.

As shown in FIG. 3, the trimming signal adjusting portion 22 can include a plurality of NAND gates ND1, ND2, . . . ND(N-1) and a NOR gate NOR1. The NOR gate NOR1 can be configured to receive the n-th decoding signal, e.g., (DEC<N>) of the decoding signals (DEC<0:N>) and the low level test signal (TM_VOL), and to perform a NOR operation thereon. As for the rest of the circuit, a description will be given by way of the first NAND gate ND1, which is one of the plurality of NAND gates. The first NAND gate ND1 receives the zero-th decoding signal (DEC<0>) and the low level test signal (TM_VOL), and performs a NAND operation thereon. A second inverter IV2 inverts the output of the first NAND gate ND1 and outputs the zero-th trimming signal (TRIM<0>).

The operation principle of the trimming signal adjusting portion 22 shown in FIG. 3 will now be described.

During the voltage trimming test, the low level test signal (TM_VOL) is enabled. Accordingly, the output of the first inverter IV1 goes low, and the output of the first NAND gate ND1 goes high regardless of the level of the zero-th decoding signal (DEC<0>). Therefore, the zero-th trimming signal (TRIM<0>), which is the output of the second inverter IV2, goes low regardless of the level of the zero-th decoding signal (DEC<0>). Similarly, the first trimming signal (TRIM<1>) goes low regardless of the level of the first decoding signal (DEC<1>). However, since the low level test signal (TM_VOL) is at a high level, the n-th trimming signal, (TRIM<N>) in this example, goes low regardless of the level of the n-th decoding signal (DEC<N>). As a result, the n-th trimming signal (TRIM<n>), which is the output of a fifth inverter IV5, goes high regardless of the level of the n-th decoding signal (DEC<n>). That is, an internal reference voltage at a level corresponding to the n-th trimming signal (TRIM<n>) is output.

Figure 4:
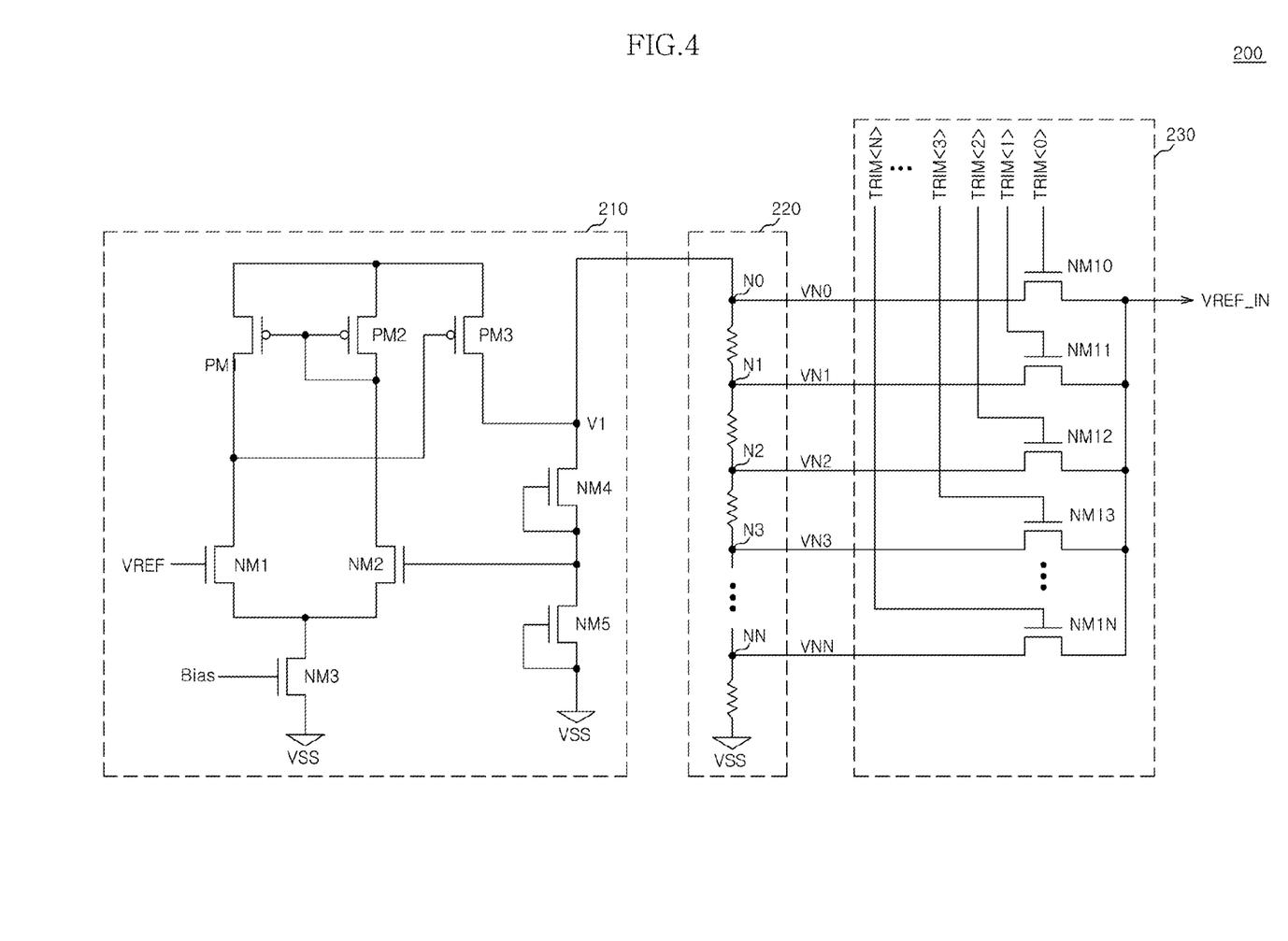
FIG. 4 is a block diagram showing an example of a reference voltage generation block included in the circuit shown in FIG. 2.

As Illustrated in the example of FIG. 4, the reference voltage generation block 200 can include a voltage generating unit 210, a voltage dividing unit 220, and a voltage selection/output unit 230.

The voltage dividing unit 220 can be configured to divide a first voltage V1 at a predetermined ratio and output a plurality of divided voltages VN0, VN1, . . . , and VNN. As shown in FIG. 4, the voltage dividing unit 220 can comprise a plurality of resistors that are connected in series. The voltage dividing unit 220 can be configured to output voltages at connection nodes of the resistors as the zero-th to N-th divided voltages VN0 to VNN.

The voltage selection/output unit 230 can be configured to output one of the divided voltages as the internal reference voltage VREF_IN in response to the plurality of trimming signals (TRIM<0:N>). The voltage selection/output unit 230 can be implemented by a plurality of transmitting elements that transmit or block the divided voltages VN0 to VNN according to the plurality of trimming signals (TRIM<0:N>). As shown in FIG. 4, the voltage selection/output unit 230 can be implemented by a plurality of NMOS transistors.

For example, if the third trimming signal (TRIM<3>) is activated, the third transmitting element NM13 is activated, and thus the corresponding third divided voltage VN3 is output as the internal reference voltage VREF_IN.

Figure 5:
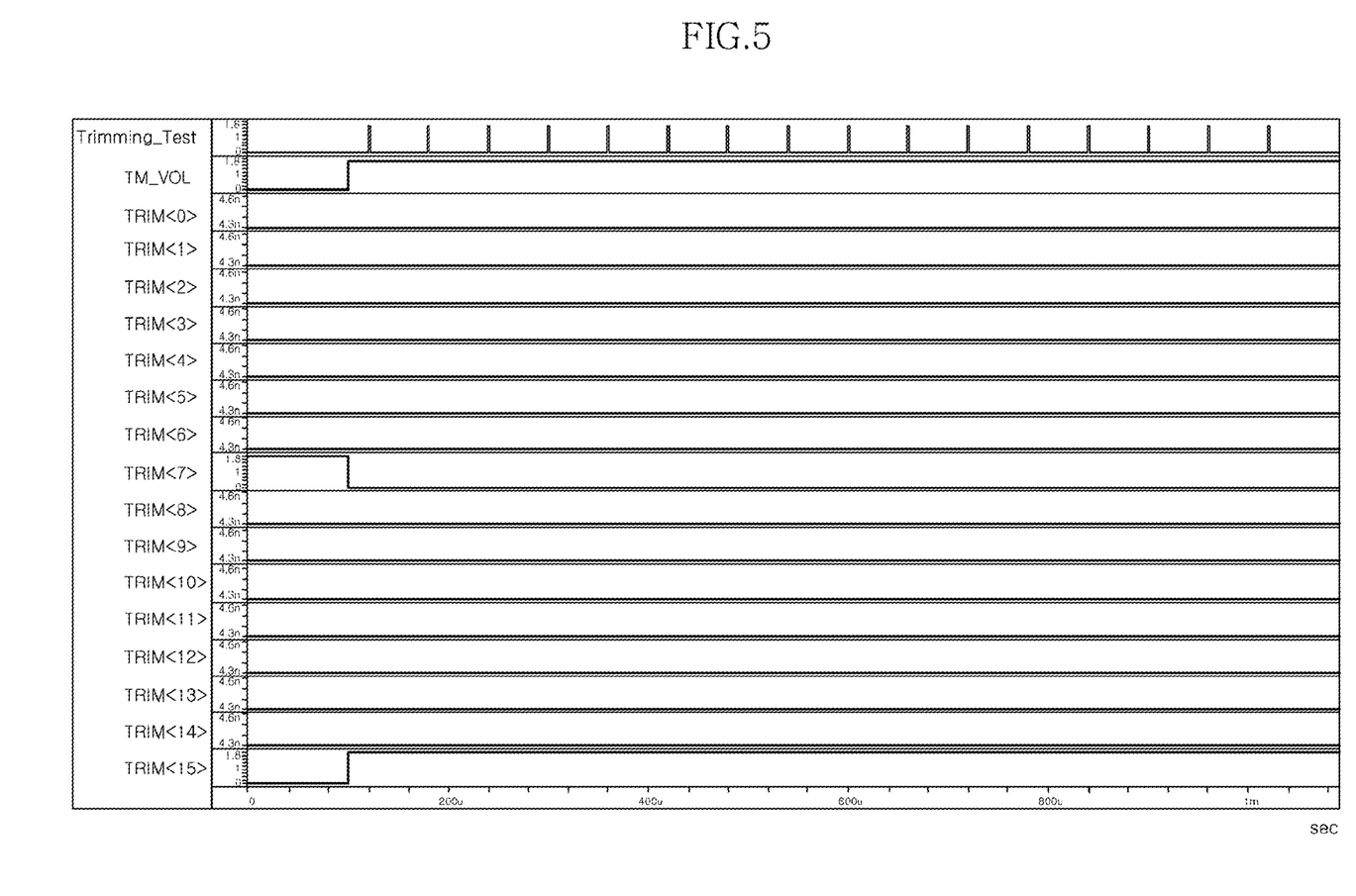
FIG. 5 is a timing diagram illustrating the operation of the test control circuit shown in FIG. 2.

Referring to FIG. 5, it can be seen that during a test, the low level test signal (TM_VOL) can be changed from a low level to a high level. At this time, the decoding signals (DEC<0: 14>) can be maintained at a low level, and the fifteenth decoding signal (DEC<15>) can be changed from a low level to a high level. In a conventional test, after the bits of decoding signal (DEC<0:14>) are sequentially enabled, the fifteenth bit, or decoding signal (DEC<15>) is enabled. In the embodiments described herein, however, the fifteenth decoding signal (DEC<15>) can immediately be changed from the low level to the high level, and the fifteenth divided voltage VN15 can be output as the internal reference voltage. Therefore, an internal reference voltage at the lowest level is selected regardless of the number of trimming times.

Figure 6:
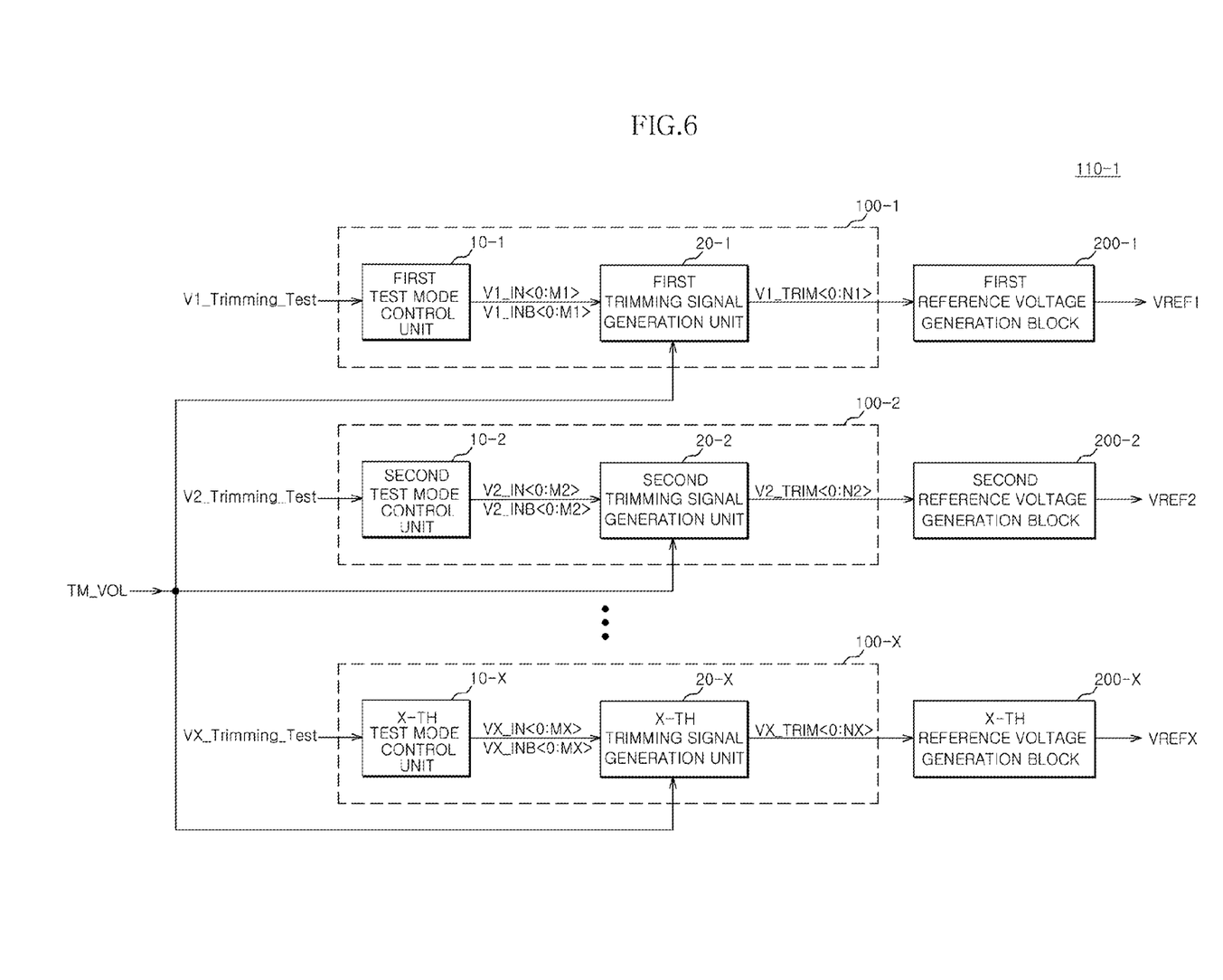
FIG. 6 is a block diagram showing a reference voltage generating circuit according to another embodiment.

Referring to FIG. 6, a reference voltage generating circuit 110-1 configured in accordance with the embodiments described herein can include a plurality of test control blocks 100-1 to 100-X that receive the low level test signal (TM_VOL), and a plurality of reference voltage generation blocks 200-1 to 200-X that generate reference voltages according to the outputs of the plurality of test mode control units 100-1 to 100-X.

The first test control block 100-1 can be configured to output one of a plurality of trimming signals (V1-TRIM<0: N1>) according to a low level test signal (TM_VOL). In addition, each of the second to X-th test control blocks 100-2 to 100-X can be configured to output one of the plurality of trimming signals according to the low level test signal (TM_VOL). The plurality of test control blocks 100-1 to 100-X can commonly receive the low level test signal.

The first reference voltage generation block 200-1 can be configured to generate a first internal reference voltage VREF1 according to the output of the first test control block 100-1. In addition, the second to X-th reference voltage generation blocks 200-2 to 200-X can be configured to generate second to X-th internal reference voltages VREF2 to VREFX according to the outputs of the second to X-th test mode control units 100-2 to 100-X. Each of the first to N-th reference voltage generation blocks 200-1 to 200-X can be a reference voltage generating circuit.

That is, as the low level test signal TM_VOL is activated, all of the reference voltage generation blocks 200-1 to 200-X can be configured to generate low-level internal reference voltages VREF1, VREF2, . . . VREFX, and the internal circuits that receive the low-level internal reference voltages form a low potential. Therefore, during a test with a low external voltage, it is possible to prevent a current from flowing from the internal circuit to the outside.

It will be apparent to those skilled in the art that various modifications and changes may be made without departing from the scope and spirit of the claims that follow.

Therefore, while certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. A test control circuit comprising:
    a test mode control unit that outputs control signal according to a voltage trimming test signal;
    a decoding portion that receives the control signal and outputs a decoding signal; and
    a trimming signal adjusting portion that receives the decoding signal and outputs a plurality of trimming signals adjusted by a low level test signal.

2. The test control circuit of claim 1,
    wherein the trimming signal adjusting portion enables one of the plurality of trimming signals according to the low level test signal.

3. The test control circuit of claim 1,
    wherein the trimming signal adjusting portion enables only a predetermined trimming signal of the plurality of the trimming signals regardless of information of the decoding signal when the low level test signal is enabled.

4. The test control circuit of claim 3,
wherein the trimming signal adjusting portion enables a trimming signal of the plurality of the trimming signals corresponding to the information of the decoding signal when the low level test signal is disabled.

5. The test control circuit of claim 4,
wherein the trimming signal adjusting portion includes:
a NOR gate that receives the predetermined trimming signal and the low level test signal, and performs an operation; and
a plurality of NAND gates that receive the plurality of trimming signals other than the predetermined trimming signal and the low level test signal, and perform an operation.

6. The test control circuit of claim 1,
wherein the test mode control unit includes a counter that counts a number of receiving of the voltage trimming test signal, and outputs the control signal according to the counting result.

7. A reference voltage generating circuit comprising:
a test mode control unit that outputs a control signal according to a voltage trimming test signal;
a trimming signal generation unit that receives the control signal and outputs a plurality of trimming signals, wherein the levels of the trimming signals are adjusted by a low level test signal; and
a reference voltage generation block that receives the trimming signals and generates an internal reference voltage.

8. The reference voltage generating circuit of claim 7,
wherein the trimming signal generation unit includes:
a decoding portion that receives the control signal and outputs a decoding signal; and
a trimming signal adjusting portion that receives the decoding signal and outputs the trimming signals, wherein the levels of the trimming signals are adjusted by the low level test signal.

9. The reference voltage generating circuit of claim 8,
wherein the trimming signal adjusting portion enables one of the plurality of trimming signals according to the low level test signal.

10. The reference voltage generating circuit of claim 8,
wherein the trimming signal adjusting portion enables only a predetermined trimming signal of the plurality of the trimming signals regardless of information of the decoding signal when the low level test signal is enabled.

11. The reference voltage generating circuit of claim 10,
wherein the trimming signal adjusting portion enables a trimming signal of the plurality of the trimming signals corresponding to the information of the decoding signal when the low level test signal is disabled.

12. The reference voltage generating circuit of claim 11,
wherein the trimming signal adjusting portion includes:
a NOR gate that receives the predetermined trimming signal and the low level test signal and performs an operation; and
a plurality of NAND gates that receive the plurality of trimming signals other than the predetermined trimming signal and the low level test signal, and perform an operation.

13. The reference voltage generating circuit of claim 7,
wherein the reference voltage generation block includes:
a voltage dividing unit that divides a first voltage and outputs a plurality of divided voltages; and
a voltage selection/output unit that outputs one of the plurality of divided voltages according to the trimming signals and supplies the output voltage as the internal reference voltage.

14. The reference voltage generating circuit of claim 13,
wherein the reference voltage generation block further includes:
a voltage generating unit that receives the reference voltage and generates the first voltage.

15. The reference voltage generating circuit of claim 7,
wherein the test mode control unit includes a counter that counts a number of receiving of the voltage trimming test signal, and outputs the control signal according to the counting result.

16. A reference voltage generating circuit comprising:
a first test control block that outputs one of a plurality of first trimming signals according to a low level test signal;
a first reference voltage generation block that generates a first internal reference voltage according to the output of the first test control block;
a second test control block that outputs one of the plurality of second trimming signals according to the low level test signal; and
a second reference voltage generation block that generates a second internal reference voltage according to the output of the second test control block.

17. The reference voltage generating circuit of claim 16,
wherein the first test control block includes:
a first test mode control unit that outputs a first control signal according to a first voltage trimming test signal;
a first decoding portion that receives the first control signal and outputs a first decoding signal; and
a first trimming signal adjusting portion that receives the first decoding signal and outputs the plurality of first trimming signals, wherein the levels of the first trimming signals are adjusted by a low level test signal, and
the second test control block includes:
a second test mode control unit that outputs a second control signal according to a second voltage trimming test signal;
a second decoding portion that receives the second control signal and outputs a second decoding signal; and
a second trimming signal adjusting portion that receives the second decoding signal and outputs the plurality of second trimming signals, wherein the levels of the second trimming signals are adjusted by the low level test signal.

18. The reference voltage generating circuit of claim 17,
wherein the first trimming signal adjusting portion enables one of the plurality of first trimming signals according to the first low level test signal, and
the second trimming signal adjusting portion enables one of the plurality of second trimming signals according to the second low level test signal.

19. The reference voltage generating circuit of claim 18,
wherein the first trimming signal adjusting portion enables only a predetermined first trimming signal regardless of information of the first decoding signal when the first low level test signal is enabled, and
the second trimming signal adjusting portion enables only a predetermined second trimming signal regardless of information of the second decoding signal when the second low level test signal is enabled.

* * * * *